(12) United States Patent
Sicard

(10) Patent No.: US 7,986,189 B1
(45) Date of Patent: Jul. 26, 2011

(54) AMPLIFIER WITH FEEDBACK

(75) Inventor: Thierry Sicard, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/770,463

(22) Filed: Apr. 29, 2010

(51) Int. Cl.
*H03F 3/16* (2006.01)
(52) U.S. Cl. .................................. 330/300; 330/277
(58) Field of Classification Search .............. 330/300, 330/277, 288
See application file for complete search history.

(56) References Cited

U.S. PATENT DOCUMENTS

| | | | |
|---|---|---|---|
| 4,596,958 A | 6/1986 | Graeme et al. | |
| 5,077,489 A * | 12/1991 | Gola et al. | 327/77 |
| 5,172,340 A | 12/1992 | Leforestier et al. | |
| 5,216,386 A * | 6/1993 | Wyatt | 330/308 |
| 5,630,228 A | 5/1997 | Mittel | |
| 6,639,473 B1 | 10/2003 | Kobayashi | |
| 6,765,438 B1 * | 7/2004 | Brosh et al. | 330/100 |

* cited by examiner

*Primary Examiner* — Henry K Choe
(74) *Attorney, Agent, or Firm* — James L. Clingan, Jr.; Joanna G. Chiu

(57) ABSTRACT

A circuit includes a first resistive element coupled to a diode, a second resistive element, a first transistor having a first current electrode coupled the second resistive element, a second transistor having a first current electrode coupled to the first resistive element and a second current electrode coupled to the control electrode of the first transistor, a third resistive element coupled to a node, a third transistor having a first current electrode coupled to the node and having a control electrode and a second current electrode each coupled to the control electrode of the second transistor, a fourth transistor having a first current electrode coupled to the second resistive element and a control electrode coupled to the control electrode of the second transistor, and a fifth transistor having a first current electrode coupled to the node and a control electrode coupled to the second current electrode of the fourth transistor.

20 Claims, 3 Drawing Sheets

AMPLIFIER WITH FEEDBACK

BACKGROUND

1. Field

This disclosure relates generally to amplifiers, and more specifically, to amplifiers with feedback.

2. Related Art

Amplifiers have a large varieties of usages including being part of a larger amplifier. For example, a power transistor commonly is controlled by an amplifier which desirably takes into the temperature of operation. The quality with which temperature or operation is taken into account is dependent upon how well this temperature is sensed. One element that varies with temperature is the forward bias voltage of PN junction. The variation in voltage is small so the amplifier which senses the change in voltage is important in the determination of the temperature and thus to how the power transistor is controlled.

Accordingly, there is a need for continuing improvement for amplifiers to sense small changes in voltage and one particular application is in temperature sensing for use in controlling a power transistor.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A circuit useful in detecting changes in a forward biased diode useful in temperature sensing operations provides a technique for matching collector voltages by taking into account a Vbe offset. This is achieved by using very little additional circuitry to achieve significant operational improvement. This is better understood by reference to the following description and the drawings.

Figure 1:
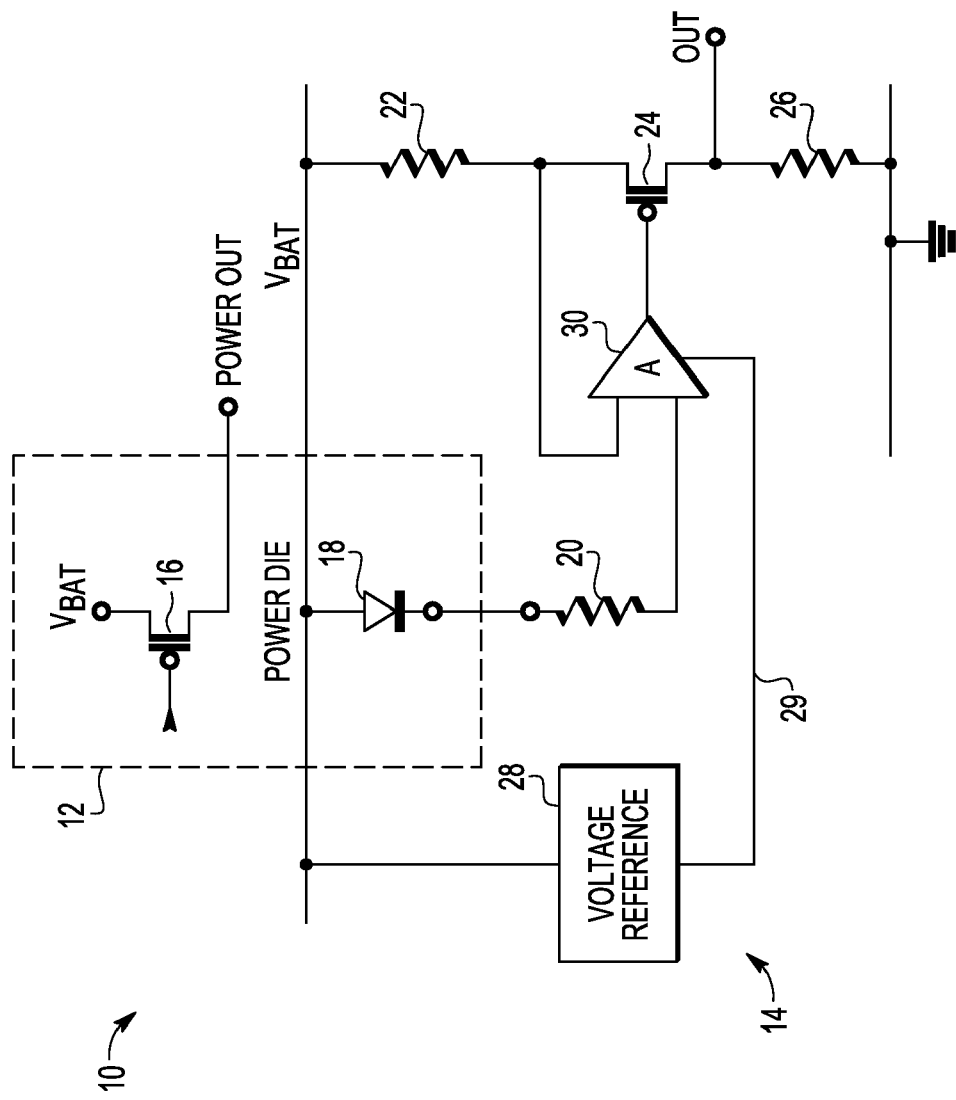
FIG. 1 is a combination block diagram and circuit diagram of circuit having an amplifier according to an embodiment.

Shown in FIG. 1 is a power transistor circuit comprising a power die 12 and a portion of a control die that includes an sensing circuit 14. Power die 12 includes a diode 18 and a power transistor 16. The control die controls transistor 16 and uses information from sensing circuit to do so. Sensing circuit 14 comprises a resistive element 20, a resistive element 22, a P channel transistor 24, a resistive element 26, a voltage reference, and an amplifier 30. Diode 18 has an anode connected to a power supply terminal which is shown as Vbat, and a cathode. Vbat may be a terminal of a car battery and thus may have a nominal voltage of 12 volts but under some conditions can be much higher such as 40 volts. Resistive element 20, which may be a resistor, has a first terminal connected to the cathode of diode 18 and a second terminal coupled to a first input of amplifier 30. Resistive element 22, which may be a resistor, has a first terminal connected to resistive element 22 and second terminal connected to a second input of amplifier 30. Transistor 24 has a source connected to the second terminal of resistive element 22, a gate connected to an output of amplifier 30, and a drain as an output OUT of sensing circuit 14. Resistive element 26 has a first terminal connected to the drain of transistor 24 and a second terminal connected to ground. Voltage reference 28 is coupled between Vbat and a negative power supply terminal 29 of amplifier 30. Voltage reference 28 is used to provide a consistent voltage for the operation of sensing circuit 14. Terminal 29 of amplifier 30 is negative in the sense that is below the level of Vbat and the difference between Vbat and the negative power supply terminal is kept constant by voltage reference 28. Because the terminal 29 is not constant but tracks Vbat, it may be called floating ground 29.

Figure 3:
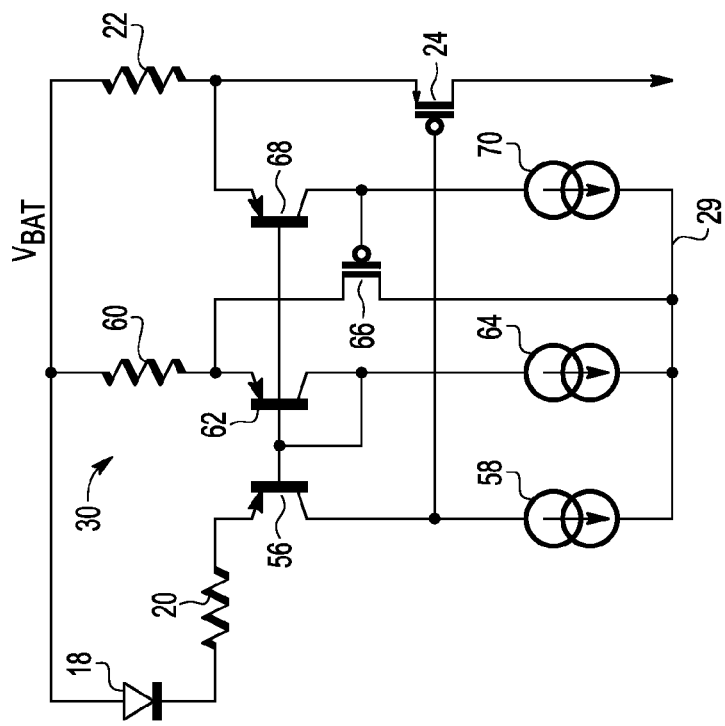
FIG. 3 is a circuit diagram of the amplifier used in the circuit of FIG. 1.

Amplifier 30 is shown in more detail in FIG. 3. The quality of the operation of sensing circuit 14 is related to the quality of operation of amplifier 30. In the prior art it is known to use amplifier 40 shown in FIG. 2 instead of amplifier 30. In operation amplifier 30 senses small changes in voltage variations across diode 18, preferably a forward biased PN junction, and amplifies those changes at output OUT. Current through diode 18 is held constant so the voltage changes across diode 18 are representative of temperature changes only.

Figure 2:
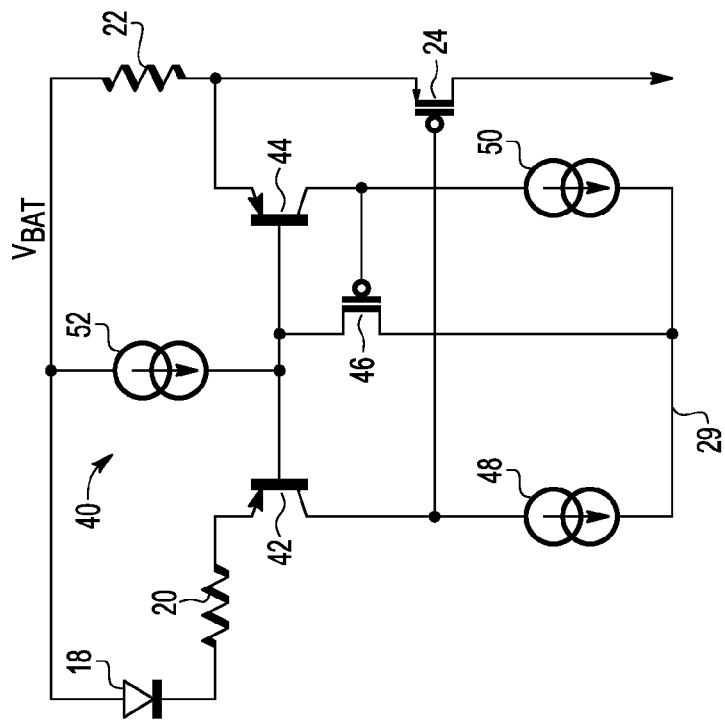
FIG. 2 is a circuit diagram of an amplifier of the prior art that could be used in the circuit of FIG. 1.

Shown in FIG. 2 is amplifier 40 in more detail, diode 18, resistor 20, resistor 22 and transistor 24. Amplifier 40 comprises a PNP transistor 42, a PNP transistor 44, a P channel transistor 46, a current source 48, a current source 50, and a current source 52. In operation current through diode 18 passes through resistor 20 and most passes through current source 48. Some of this source current becomes base current and passes through transistor 46. Small changes in voltage across diode 18 is reflected onto the bases of transistors 42 and 44 and the collector transistor 42. This change is amplified by transistor 44 and transistor 24 to provide an output at the drain of transistor 24.

Shown in FIG. 3 is amplifier 30 in more detail. Amplifier 30 comprises a PNP transistor 56, a current source 58, a resistive element 60, a PNP transistor 62, a current source 64, a P channel transistor 66, a PNP transistor 68, and a current source 70, Transistor 56 has an emitter connected to the second terminal of resistor 20 and considered the first input of amplifier 30. Transistors 56, 62, and 58 have their bases connected together. Current source 58 has a first terminal connected to a collector of transistor 56 and a second terminal connected to floating ground 29. Resistive element 60 has a first terminal connected to Vbat and a second terminal connected to a emitter of transistor 62. Transistor 62 has a collector connected to its base. Current source 64 has a first terminal connected to the collector of transistor 62 and a second terminal connected to floating ground 29. Transistor 66 has a source connected to the emitter of transistor 62, a gate connected to a collector of transistor 68, and a drain connected to floating ground 29. Current source 70 has a first terminal connected to the collector of transistor 68 and a second terminal connected to floating ground 29.

In operation changes in voltage across diode 18 are reflected onto the bases of transistors 56, 62, and 68 and the collector of transistor 56. This change then is amplified by the operation of transistors 56, 68, and 24. The operation of transistor 66 is now based on its source being a Vbe higher than the bases of transistors 56 and 68. This feedback has the effect of raising the voltage on the collector of transistor 68 by a Vbe as well. In amplifier 40 of FIG. 2, the collector of transistor 44 is a Vbe lower than the collector of transistor 42 and thus the emitter-collector voltages of transistors 42 and 44 are not matched whereas the emitter-collector voltages of transistors 56 and 68 are matched. In addition to the balancing of the bias of transistors 56 and 68, the emitter of transistor 62 is an amplifying input as well. Transistors 56, 62, and 68 are matched as are resistive elements 20, 60, and 22. Further, P channel transistors 66 and 24 are also biased with the same current, so the gate to source voltage (Vgs) of transistor 66 is equal to the Vgs of transistor 24. With this balance and the additional amplification, there is a significant increase in the linearity of the response of output OUT to changes in the voltage changes across diode 18.

Figure 4:
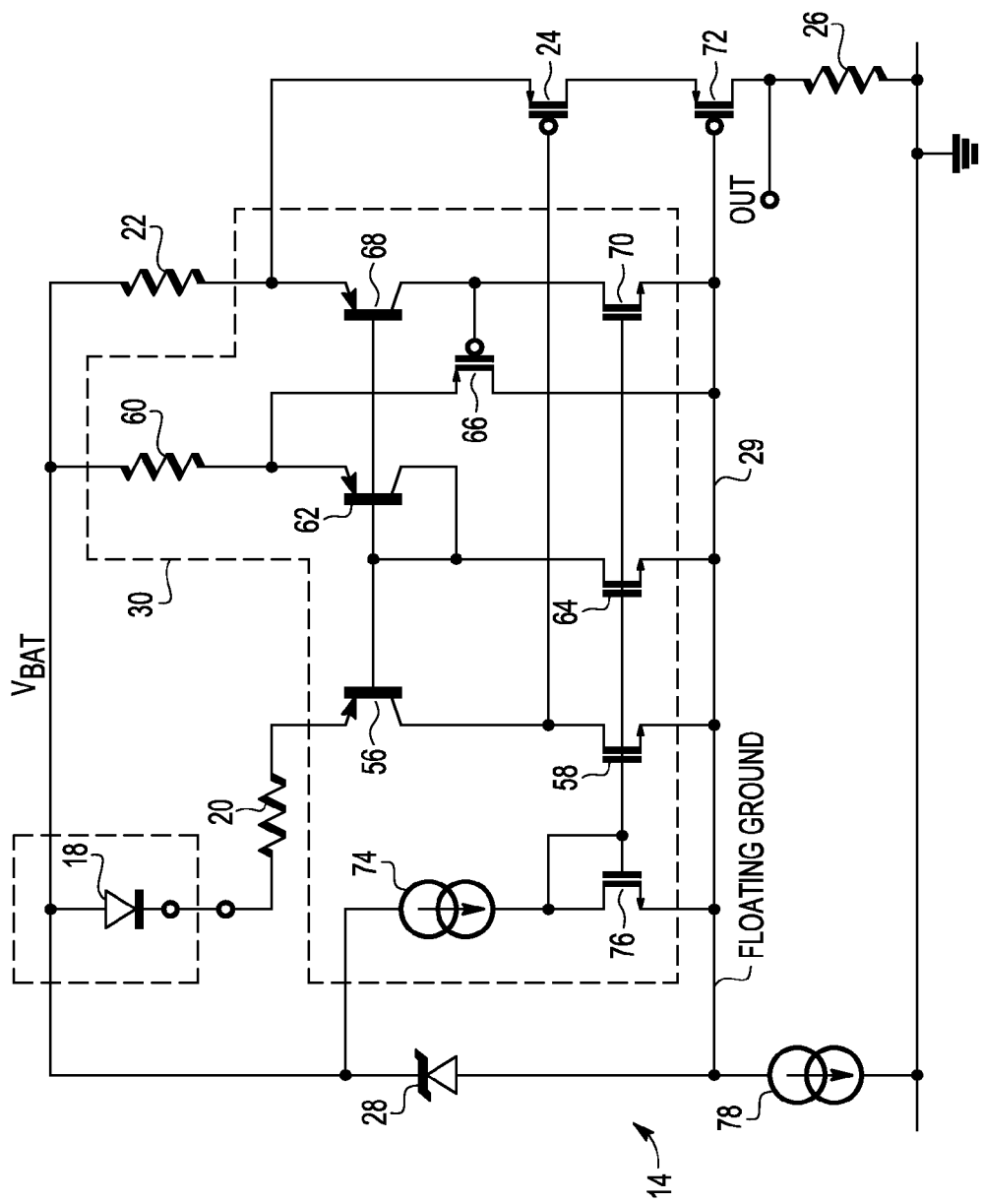
FIG. 4 is a more detailed circuit diagram of the circuit of FIG. 1 utilizing the amplifier of FIG. 3.

Shown in FIG. 4 is a circuit 14 in more detail. Additional circuitry not shown in FIG. 3 is P channel transistor 72, a current source 74, an N channel transistor 76, and a current source 78. Transistor 72 is interposed between the first terminal of resistive element 26 and the drain of transistor 24. Transistor 72 has a source connected to the drain of transistor 24, a gate connected to floating ground 29, and a drain connected to the second terminal of resistive element 26. Transistor 72 is connected as a cascade device to provide level shift to provide an output based on ground as shifted based on floating ground 29. Current source 74 has a first terminal connected to Vbat and a second terminal connected to the drain and gate of transistor 76. Transistor 76 has a source connected to floating ground 29. Current sources 58, 64, and 70 are implemented as N channel transistors as shown in FIG. 4 as N channel transistors 58, 64, and 70, respectively, with their gates connected to the second terminal of current source 74. Transistor 76 and current source 74 function as a bias for current sources 58, 64, and 70. Also shown is reference voltage 28 implemented as a zener diode.

Thus, amplifier 30 is useful in providing an output with higher gain and symmetry so as to provide high linearity and gain for sensing small changes. This is particularly useful in the case of using a forward biased diode as a heat sensor.

By now it should be appreciated that there has been provided a circuit including a first resistive element having a first terminal coupled to a cathode of a diode and having a second terminal, wherein the diode provides an input to the circuit. The circuit further includes a second resistive element having a first terminal coupled to a first power supply terminal and having a second terminal. The circuit further includes a first transistor having a first current electrode coupled to the second terminal of the second resistive element, a control electrode, and a second control electrode coupled to provide an output of the circuit. The circuit further includes a second transistor having a first current electrode coupled to the second terminal of the first resistive element, a control electrode, and a second current electrode coupled to the control electrode of the first transistor. The circuit further includes a third resistive element having a first terminal coupled to the first power supply terminal and a second terminal coupled to a first circuit node. The circuit further includes a third transistor having a first current electrode coupled to the first circuit node, a control electrode coupled to the control electrode of the second transistor, and a second current electrode coupled to the control electrode of the second transistor. The circuit further includes a fourth transistor having a first current electrode coupled to the second terminal of the second resistive element, a control electrode coupled to the control electrode of the second transistor, and a second current electrode. The circuit further includes a fifth transistor having a first current electrode coupled to the first circuit node, a second current electrode, and a control electrode coupled to the second current electrode of the fourth transistor. The circuit may further include a first current source having a first terminal coupled to the second current electrode of the second transistor and a second current electrode coupled to a second circuit node; a second current source having a first terminal coupled to the second current electrode of the third transistor and a second current electrode coupled to the second circuit node; and a third current source having a first terminal coupled to the second current electrode of the fourth transistor and a second current electrode coupled to the second circuit node. The circuit may further include a sixth transistor having a first current electrode coupled to the second terminal of the first transistor, a control electrode coupled to the second circuit node, and a second current electrode which provides the output of the circuit. The circuit may further include a voltage reference having a first terminal coupled to the first power supply terminal and a second terminal coupled to the second circuit node. The circuit may have a further characterization by which the voltage reference comprises a zener diode having a cathode coupled to the first power supply terminal and an anode coupled to the second circuit node. The circuit may have a further characterization by which each of the second, third, and fourth transistors are further characterized as bipolar transistors. The circuit may have a further characterization by which a voltage at the first circuit node is at a base-to-emitter voltage of the third transistor above a base voltage of the fourth transistor. The circuit may have a further characterization by which a ratio of the output of the circuit to the input to the circuit varies proportionally with temperature of the diode. The circuit may further include a reference voltage having a first terminal coupled to the first power supply terminal and having a second terminal; and a sixth transistor having a first current electrode coupled to the second current electrode of the first transistor, a control electrode coupled to the second terminal of the reference voltage, and a second current electrode which provides the output of the circuit. The circuit may further include a fourth resistive element having a first terminal coupled to the second terminal of the sixth transistor and a second terminal coupled to a second power supply terminal.

Also disclosed is a circuit including a first resistive element having a first terminal coupled to a cathode of a diode and having a second terminal, wherein the diode provides an input to the circuit. The circuit further includes a second resistive element having a first terminal coupled to a first power supply terminal (Vbat) and having a second terminal. The circuit further includes a first transistor having a first current electrode coupled to the second terminal of the second resistive element, a control electrode, and a second current electrode coupled to provide an output of the circuit. The circuit further includes an amplifier having a first input coupled to the second terminal of the second resistive element, a second input coupled to the second terminal of the first resistive element, and an output coupled to the control electrode of the first transistor. The amplifier includes a second transistor having a first current electrode coupled to the second terminal of the first resistive element a control electrode, and a second current electrode coupled to the control electrode of the first transistor wherein a first transistor voltage is defined as a voltage from the control electrode of the second transistor to the first current electrode of the second transistor. The amplifier further includes a third transistor having a first current electrode coupled to the second terminal of the second resistive element, a control electrode coupled to the control electrode of the second transistor, and a second current electrode. The amplifier further includes a fourth transistor having a first current electrode, a control electrode coupled to the second current electrode of the third transistor, and a second current electrode, wherein a voltage at the first current electrode of the fourth transistor is greater than a voltage at the control electrode of the third transistor by an amount equal to the first transistor voltage. The circuit may further comprise a third resistive element having a first terminal coupled to the first power supply terminal and a second terminal coupled to the first current electrode of the fourth transistor; and a fifth transistor having a first current electrode coupled to the first current electrode of the fourth transistor, a control electrode coupled to the control electrode of the second transistor, and a second current electrode coupled to the control electrode of the second transistor. The circuit may further comprise a first current source having a first terminal coupled to the second current electrode of the second transistor and a second current electrode coupled to a circuit node; a second current source having a first terminal coupled to the second current electrode of the third transistor and a second current electrode coupled to the circuit node; and a third current source having a first terminal coupled to the second current electrode of the fourth transistor and a second current electrode coupled to the circuit node. The circuit may have a further characterization by which each of the second, third, and fifth transistors are further characterized as bipolar transistors. The circuit may further comprise a voltage reference having a first terminal coupled to the first power supply terminal and a second terminal coupled to a circuit node. The circuit may further comprise a fifth transistor having a first current electrode coupled to the second terminal of the first transistor, a control electrode coupled to the circuit node, and a second current electrode which provides the output of the circuit. The circuit may have a further characterization by which the voltage reference comprises a zener diode having a cathode coupled to the first power supply terminal and an anode coupled to the circuit node. The circuit may have a further characterization by which a ratio of the output of the circuit to the input to the circuit varies proportionally with temperature of the diode.

Disclosed also is a circuit including a first resistive element having a first terminal coupled to a cathode of a diode and having a second terminal, wherein the diode provides an input to the circuit. The circuit further includes a second resistive element having a first terminal coupled to a first power supply terminal and having a second terminal. The circuit further includes a first transistor having a first current electrode coupled to the second terminal of the second resistive element, a control electrode, and a second control electrode. The circuit further includes a zener diode having a cathode coupled to the first power supply terminal and an anode coupled to a first circuit node. The circuit further includes a sixth transistor having a first current electrode coupled to the second terminal of the first transistor, a control electrode coupled to the first circuit node, and a second current electrode which provides an output of the circuit. The circuit further includes an amplifier having a first input coupled to the second terminal of the second resistive element, a second input coupled to the second terminal of the first resistive element, and an output coupled to the control electrode of the first transistor. The amplifier includes a second transistor having a first current electrode coupled to the second terminal of the second resistive element, a control electrode, and a second current electrode coupled to the control electrode of the first transistor. The amplifier further includes a third resistive element having a first terminal coupled to the first power supply terminal and a second terminal coupled to a second circuit node. The amplifier further includes a third transistor having a first current electrode coupled to the second circuit node, a control electrode coupled to the control electrode of the second transistor, and a second current electrode coupled to the control electrode of the second transistor. The amplifier further includes a fourth transistor having a first current electrode coupled to the second terminal of the second resistive element, a control electrode coupled to the control electrode of the second transistor, and a second current electrode. The amplifier further includes a fifth transistor having a first current electrode coupled to the second circuit node, a second current electrode, and a control electrode coupled to the second current electrode of the fourth transistor. The amplifier further includes a first current source having a first terminal coupled to the second current electrode of the second transistor and a second current electrode coupled to the first circuit node. The amplifier further includes a second current source having a first terminal coupled to the second current electrode of the third transistor and a second current electrode coupled to the first circuit node. The amplifier further includes a third current source having a first terminal coupled to the second current electrode of the fourth transistor and a second current electrode coupled to the first circuit node. The amplifier may have a further characterization by which a ratio of the output of the circuit to the input to the circuit varies proportionally with temperature of the diode.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, current sources are shown as N channel transistors biased by a common output, but another type of current source may be found to be useful. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. A circuit comprising:
 a first resistive element having a first terminal coupled to a cathode of a diode and having a second terminal, wherein the diode provides an input to the circuit;

a second resistive element having a first terminal coupled to a first power supply terminal and having a second terminal;

a first transistor having a first current electrode coupled to the second terminal of the second resistive element, a control electrode, and a second control electrode coupled to provide an output of the circuit;

a second transistor having a first current electrode coupled to the second terminal of the first resistive element, a control electrode, and a second current electrode coupled to the control electrode of the first transistor;

a third resistive element having a first terminal coupled to the first power supply terminal and a second terminal coupled to a first circuit node;

a third transistor having a first current electrode coupled to the first circuit node, a control electrode coupled to the control electrode of the second transistor, and a second current electrode coupled to the control electrode of the second transistor;

a fourth transistor having a first current electrode coupled to the second terminal of the second resistive element, a control electrode coupled to the control electrode of the second transistor, and a second current electrode; and a fifth transistor having a first current electrode coupled to the first circuit node, a second current electrode, and a control electrode coupled to the second current electrode of the fourth transistor.

2. The circuit of claim 1, further comprising:

a first current source having a first terminal coupled to the second current electrode of the second transistor and a second current electrode coupled to a second circuit node;

a second current source having a first terminal coupled to the second current electrode of the third transistor and a second current electrode coupled to the second circuit node; and a third current source having a first terminal coupled to the second current electrode of the fourth transistor and a second current electrode coupled to the second circuit node.

3. The circuit of claim 2, further comprising:

a sixth transistor having a first current electrode coupled to the second terminal of the first transistor, a control electrode coupled to the second circuit node, and a second current electrode which provides the output of the circuit.

4. The circuit of claim 2, further comprising:

a voltage reference having a first terminal coupled to the first power supply terminal and a second terminal coupled to the second circuit node.

5. The circuit of claim 4, wherein the voltage reference comprises a zener diode having a cathode coupled to the first power supply terminal and an anode coupled to the second circuit node.

6. The circuit of claim 1, wherein each of the second, third, and fourth transistors are further characterized as bipolar transistors.

7. The circuit of claim 6, wherein a voltage at the first circuit node is at a base-to-emitter voltage of the third transistor above a base voltage of the fourth transistor.

8. The circuit of claim 1, wherein a ratio of the output of the circuit to the input to the circuit varies proportionally with temperature of the diode.

9. The circuit of claim 1, further comprising:

a reference voltage having a first terminal coupled to the first power supply terminal and having a second terminal; and a sixth transistor having a first current electrode coupled to the second current electrode of the first transistor, a control electrode coupled to the second terminal of the reference voltage, and a second current electrode which provides the output of the circuit.

10. The circuit of claim 9, further comprising:

a fourth resistive element having a first terminal coupled to the second terminal of the sixth transistor and a second terminal coupled to a second power supply terminal.

11. A circuit comprising:

a first resistive element having a first terminal coupled to a cathode of a diode and having a second terminal, wherein the diode provides an input to the circuit;

a second resistive element having a first terminal coupled to a first power supply terminal (Vbat) and having a second terminal;

a first transistor having a first current electrode coupled to the second terminal of the second resistive element, a control electrode, and a second current electrode coupled to provide an output of the circuit; and an amplifier having a first input coupled to the second terminal of the second resistive element, a second input coupled to the second terminal of the first resistive element, and an output coupled to the control electrode of the first transistor, wherein the amplifier comprises:

a second transistor having a first current electrode coupled to the second terminal of the first resistive element a control electrode, and a second current electrode coupled to the control electrode of the first transistor wherein a first transistor voltage is defined as a voltage from the control electrode of the second transistor to the first current electrode of the second transistor;

a third transistor having a first current electrode coupled to the second terminal of the second resistive element, a control electrode coupled to the control electrode of the second transistor, and a second current electrode; and a fourth transistor having a first current electrode, a control electrode coupled to the second current electrode of the third transistor, and a second current electrode, wherein a voltage at the first current electrode of the fourth transistor is greater than a voltage at the control electrode of the third transistor by an amount equal to the first transistor voltage.

12. The circuit of claim 11, further comprising:

a third resistive element having a first terminal coupled to the first power supply terminal and a second terminal coupled to the first current electrode of the fourth transistor; and a fifth transistor having a first current electrode coupled to the first current electrode of the fourth transistor, a control electrode coupled to the control electrode of the second transistor, and a second current electrode coupled to the control electrode of the second transistor.

13. The circuit of claim 12, further comprising:

a first current source having a first terminal coupled to the second current electrode of the second transistor and a second current electrode coupled to a circuit node;

a second current source having a first terminal coupled to the second current electrode of the third transistor and a second current electrode coupled to the circuit node; and a third current source having a first terminal coupled to the second current electrode of the fourth transistor and a second current electrode coupled to the circuit node.

14. The circuit of claim 13, wherein each of the second, third, and fifth transistors are further characterized as bipolar transistors.

15. The circuit of claim 11, further comprising:
a voltage reference having a first terminal coupled to the first power supply terminal and a second terminal coupled to a circuit node.

16. The circuit of claim 15, further comprising:
a fifth transistor having a first current electrode coupled to the second terminal of the first transistor, a control electrode coupled to the circuit node, and a second current electrode which provides the output of the circuit.

17. The circuit of claim 16, wherein the voltage reference comprises a zener diode having a cathode coupled to the first power supply terminal and an anode coupled to the circuit node.

18. The circuit of claim 11, wherein a ratio of the output of the circuit to the input to the circuit varies proportionally with temperature of the diode.

19. A circuit comprising:
a first resistive element having a first terminal coupled to a cathode of a diode and having a second terminal, wherein the diode provides an input to the circuit;
a second resistive element having a first terminal coupled to a first power supply terminal and having a second terminal;
a first transistor having a first current electrode coupled to the second terminal of the second resistive element, a control electrode, and a second control electrode;
a zener diode having a cathode coupled to the first power supply terminal and an anode coupled to a first circuit node;
a sixth transistor having a first current electrode coupled to the second terminal of the first transistor, a control electrode coupled to the first circuit node, and a second current electrode which provides an output of the circuit; and
an amplifier having a first input coupled to the second terminal of the second resistive element, a second input coupled to the second terminal of the first resistive element, and an output coupled to the control electrode of the first transistor, wherein the amplifier comprises:
a second transistor having a first current electrode coupled to the second terminal of the second resistive element, a control electrode, and a second current electrode coupled to the control electrode of the first transistor;
a third resistive element having a first terminal coupled to the first power supply terminal and a second terminal coupled to a second circuit node;
a third transistor having a first current electrode coupled to the second circuit node, a control electrode coupled to the control electrode of the second transistor, and a second current electrode coupled to the control electrode of the second transistor;
a fourth transistor having a first current electrode coupled to the second terminal of the second resistive element, a control electrode coupled to the control electrode of the second transistor, and a second current electrode;
a fifth transistor having a first current electrode coupled to the second circuit node, a second current electrode, and a control electrode coupled to the second current electrode of the fourth transistor;
a first current source having a first terminal coupled to the second current electrode of the second transistor and a second current electrode coupled to the first circuit node;
a second current source having a first terminal coupled to the second current electrode of the third transistor and a second current electrode coupled to the first circuit node; and
a third current source having a first terminal coupled to the second current electrode of the fourth transistor and a second current electrode coupled to the first circuit node.

20. The circuit of claim 19, wherein a ratio of the output of the circuit to the input to the circuit varies proportionally with temperature of the diode.

\* \* \* \* \*